US006823876B1

United States Patent
Chang et al.

(10) Patent No.: US 6,823,876 B1
(45) Date of Patent: Nov. 30, 2004

(54) METHODOLOGY OF ROTATIONAL ETCHING TOOL MAINTENANCE

(75) Inventors: Yuan-Hsun Chang, Miaoli (TW); Ming-Hsien Chang, Changhua (TW); Chung-Ping Lin, Hsinchu (TW); Tzu-Hao Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/653,315

(22) Filed: Sep. 2, 2003

(51) Int. Cl.[7] ................................................. B08B 9/00
(52) U.S. Cl. ................ 134/22.1; 134/22.12; 134/22.18; 134/23; 134/32; 134/33; 134/34; 134/36; 134/42; 134/61; 134/94.1; 134/99.1; 134/149; 134/153; 134/158; 134/902
(58) Field of Search ............................ 134/22.1, 22.12, 134/22.18, 23, 32, 33, 34, 36, 42, 61, 94.1, 99.1, 149, 153, 158, 902

(56) References Cited

U.S. PATENT DOCUMENTS

| | | | |
|---|---|---|---|
| 4,674,521 A | * 6/1987 | Paulfus ................... 134/167 R |
| 6,159,288 A | * 12/2000 | Satou et al. ................... 118/70 |
| 6,221,781 B1 | * 4/2001 | Siefering et al. ........... 438/704 |
| 6,589,338 B1 | * 7/2003 | Nakamori et al. ............. 118/50 |
| 6,702,900 B2 | * 3/2004 | Yeh et al. ................... 118/730 |
| 2002/0074020 A1 | * 6/2002 | Ono et al. ..................... 134/21 |
| 2002/0179120 A1 | * 12/2002 | Ono et al. ..................... 134/26 |

* cited by examiner

Primary Examiner—Sharidan Carrillo
(74) Attorney, Agent, or Firm—Thomas, Kayden, Horstemeyer & Risley

(57) ABSTRACT

A method of cleaning and maintenance used for a rotational etching tool, combining the physical characteristics of water (splashed off after striking the surface of a spinning wafer) and a PM (preventive maintenance) computer program, can automatically and quickly clean the interior of the etching tool. By setting the appropriate parameters of PM program, single or all of process chambers can be well cleaned. Also, the DI water dropping positions on the wafer can be altered to create more splashing angles. To clean the sidewalls of the etching chambers, the wafer supporting means is moved between the process chamber and the rotating speed thereof is preferably alter while it is moving. The PM program of the present invention can be executed whenever the cleaning job needs to be done. It not only is timesaving and easy to apply, but also keeps the wafer in a almost-no-particle environment while being etched.

30 Claims, 5 Drawing Sheets

METHODOLOGY OF ROTATIONAL ETCHING TOOL MAINTENANCE

BACKGROUND OF THE INVENTION

1. Field of the Invention

The invention relates in general to a method of cleaning and maintenance used for a rotational etching tool, and more particularly to a method combining a PM (preventive maintenance) computer program to clean the rotational etching tool automatically and rapidly.

2. Description of the Related Art

The machines of manufacturing the semiconductors, in the form of so-called wafer (disk-shaped article based on silicon) require preventive maintenance (PM). For example, the maintenance of rotational etching tool, for treating one wafer in each case with at least two media and with a carrier to hold the wafer, has been performed with the hands by ejecting deionized (DI) water from a DI gun. However, the steps of PM, such as mechanical disassembly before DI water ejection, are usually complicated and time-consuming.

Recently, the most commercial successful rotational etching tools are provided by SEZ Semiconductor-Equipment Zubehor furdie Habbleiterfertigung (Villach, AT). The related mechanical structure and function in details have been disclosed in U.S. patents, such as U.S. Pat. No. 4,903,717, U.S. Pat. No. 6,536,454 and U.S. Pat. No. 6,383,331. The etching may be of a dry type (etched by gases) or wet type (etched by chemical liquids). FIG. 1 illustrates a sectional view of a rotational etching tool. There are several etching chambers, a cleaning chamber 104, and a wafer supporting means such as chuck 112 in the process room 102. Those etching chambers situated below the cleaning chamber 104 are the first etching chamber 106, the second etching chamber 108 and the third etching chamber 109 (from the top down). The chuck 112 is used for holding the wafer 116 by the lateral guiding elements (often also called pins) 114, projected from the top surface 112a of the chuck 112. The lateral guiding elements 114 are guided excentrically and grip the wafer 116 along its periphery in the operational position. The wafer 116 is held aligned parallel to the top surface 112a of the chuck 112. Here holding wafer can be done using a vacuum or the wafer 116 floats on an air cushion and is prevented from sliding off sideways by lateral guiding elements 114. The lack of physical contact between the rest of the wafer 116 with the top surface 112a of the chuck 112 helps to prevent damage to the wafer during treatment.

The chuck 112 may further has a gas supply channel (not shown). A gas, supplied through the channel and existing between the wafer 116 and chuck 112, is jetted against the guiding elements 114 and the adjacent portion of the lower surface of the wafer 116. In this way, the passage of etching fluid to the underside of the wafer 116 can be prevented, especially the undesirable etched potions in the region of the guiding elements 114 (so-called pin mark). Also, the chuck 112 is connected to a shaft 118 within an elevated part 120, so that the chuck 112 can be rotated on the shaft 118, and moved back and forth between the cleaning chamber 104 and the etching chambers (106, 108 and 109) in the direction of the arrow F.

In wet-etching process, the treatment liquid (such as etching liquid and rinse water) and gas (such as $N_2$ and isopropyl alcohol (IPA)) are stored in the liquid tanks and gas tanks, respectively. The treatment fluid (liquid and gas) can be transported via the medium conduit to the conduit terminate, such as medium nozzle. The medium nozzles positioned at a distance from the wafer will discharge the media according to the stage requirement of etching process. Also, each etching chamber is connected to the associated etching liquid tank via a conduit, for recycle of etching liquid. The cleaning chamber is connected to a discharge conduit to drain the deionized water after rinse.

As shown in FIG. 1, the first etching liquid 136, the second etching liquid 138 and the third etching liquid 139 are stored in the first etching liquid tank 126, the second etching liquid tank 128 and the third etching liquid tank 129, respectively; also, are transported via the first conduit 146, the second conduit 148 and the third conduit 149 to the first medium nozzle 156, the second medium nozzle 158 and third medium nozzle 159, respectively. Preferably, those medium nozzles (156, 158 and 159) are positioned in a joint aperture, such as a medium dispenser 160, to maintain the relative distance between the chuck 112 and nozzles. The DI water nozzle and $N_2$ nozzle are also positioned above the wafer 116 to eject DI water and $N_2$ as required. Furthermore, the first etching chamber 106, the second etching chamber 108 and the third etching chamber 109 are connected to the first etching liquid tank 126, the second etching liquid tank 128 and the third etching liquid tank 129, respectively. Each conduit leads to a three-way valve (not shown). By appropriate setting the valves, etching liquid withdrawn from the etching chamber can either be recycled into the etching liquid tank, or drained through the discharge conduit.

General steps of wet-etching process are described as follows:

(a) Wafer 116 over the chuck 112 is rotated around its axis at a certain speed, and the surface of the wafer 116 is then wetted with a liquid, for example, deionized water.

(b) The chuck 112 is moved to the position associated with the appropriate etching chamber. For example, the chuck 112 is moved downward to the first etching chamber 106 if the first etching liquid 126 is required to use. Then, the etching liquid is applied to the wetted surface of the wafer 116.

(c) The surface of the wafer 116 is washed with a non-etching liquid (such as deionized water), and dried with a volatile gas (such as $N_2$).

The etching liquid comprises at least one of following acids: hydrofluoric acid, nitric acid, phosphoric acid and sulfuric acid. In semiconductor manufacturing, it is known that a silicon dioxide layer can be etched with aqueous hydrofluoric acid, water-soluble hexafluorosilicic acid ($H_2SiF_6$) being formed. Addition of ammonium fluoride to hydrofluoric acid is also known, and this etching liquid is so-called as "BHF" (buffered hydrogen fluoride) or "BOE" (buffered oxide etch). After the etching process is conducted for several times, it is required to do the cleaning and maintenance job for the interior of etching tool, especially "BOE" being applied as one of etching liquids. When BOE is applied to the surface of the spinning wafer 116, it is thrown off and adheres to the walls of the etching chamber, and turns into the form of crystal-powder after drying. Those BOE powders (numeral 170) accumulated in etching chamber will contaminate the wafer; thus, it requires a regular cleaning and maintenance to remove those BOE powders.

FIG. 2 is a block diagram of a conventional PM (Preventive Maintenance) process for rotational etching tool. The conventional PM process comprises the steps of:

(1) Preparation for maintenance—the maintenance crew need to wear chemical splash goggles, a chemical resistant apron or garment, and chemical resistant gloves; also, cleanroom wipers, cotton wraps and IPA (isopropyl alcohol) should be ready to use.

(2) Disassembly of etching tool hardware—the medium dispenser 160 is detached first, and then the chuck 112 is removed from the process room 102.

(3) Clean and wipe—the walls and edges of etching chambers are cleaned by DI water using DI gun (held by man), and then dried by cleanroom wipers.

(4) Reassembly of etching tool hardware and test—the chuck 112 and the medium dispenser 160 are put back, and then the chuck movement is checked to make sure it works well.

(5) Wipe with IPA—the chuck 112, the medium dispenser 160 and the accessory around are wiped with IPA.

(6) flush conduits (pipes), comprising steps of:

(a) refilling DI water in etching liquid tank and flushing the conduits with DI water;

(b) refilling etching liquid in etching liquid tank and flushing the conduits with etching liquid (i.e. to flush DI water residue in the conduits away); and (c) refilling etching liquid in etching liquid tank again.

The PM frequency depends on how often the etching process is conducted; generally, one time a week. It takes about 6 hours for the maintenance crew to run through the whole procedures of FIG. 2. Thus, the conventional PM method is not only time-consuming but also laborexhausted. Moreover, if large quantities of wafers need to be etched, it is a critical step to clean and maintain the intensively operated etching tool during wafer etching, for the purpose of reducing the particle contamination. The timeconsuming conventional PM method, however, is going to prolong the etching process, thus increasing the time cost and production cost.

SUMMARY OF THE INVENTION

It is therefore an object of the invention to provide a method of cleaning and maintenance used for a rotational etching tool. By combining the physical characteristics of water (splashed off after striking the surface of a spinning wafer) and a PM (preventive maintenance) computer program, the method can be automatically and quickly applied to do the cleaning job.

The invention achieves the first object by providing a method of cleaning and maintenance used for a rotational etching tool, particularly used for cleaning inner wall of a single process chamber. The rotational etching tool comprises a wafer supporting means and at least two process chambers, the wafer supporting means is moveable between the process chambers, at least a nozzle is positioned above the wafer supporting means for ejecting a cleaning liquid. The method comprises steps of:

(a) floating a wafer over the wafer supporting means, and moving the wafer supporting means to a position associated with one of the process chambers;

(b) applying the cleaning liquid to the wafer;

(c) spinning the wafer supporting means at the first rotating speed for the first duration;

(d) changing the rotation speed of the wafer supporting means to the third rotating speed for the third duration; and (e) repeating steps of (c) and (d).

The invention achieves the second object by providing another method of cleaning and maintenance used for a rotational etching tool, particularly used for cleaning the sidewalls of the process chambers. The rotational etching tool comprises a wafer supporting means and at least two process chambers, the wafer supporting means is moveable between the process chambers, at least a nozzle is positioned above the wafer supporting means for ejecting a cleaning liquid. The method comprises steps of:

(a) floating a wafer over the wafer supporting means, and moving the wafer supporting means to a position associated with one of the process chambers;

(b) applying the cleaning liquid to the wafer;

(c) spinning the wafer supporting means at the first rotating speed for the first duration;

(d) moving the wafer supporting means to another position associated with another process chamber, and then changing the rotation speed of the wafer supporting means to the second rotating speed and rotating for the second duration; and (e) repeating steps of (c) and (d).

The invention achieves the third object by combining the two methods described above to clean each process chamber and the sidewall thereof.

The process chambers could be a cleaning chamber, and one or several etching chambers. The cleaning liquid could be deionized (DI) water. The etching liquid could be any liquid generally used in the etching process; for example, a buffered mixture comprising ammonium fluoride and hydrofluoric acid.

Other objects, features, and advantages of the invention will become apparent from the following detailed description of the preferred but non-limiting embodiments. The following description is made with reference to the accompanying drawings.

DETAILED DESCRIPTION OF THE INVENTION

In the present invention, the physical characteristics of water combined with a PM (preventive maintenance) program are utilized. By setting the appropriate parameters, every possible position of the etching chambers can be washed while running the PM program. The invention programs the computer to do the cleaning and maintenance job instead of manual operation, and it takes only 15 minutes to run through the whole program. Thus, the cleaning and maintenance method of the invention not only is rapid and easy to use, but also can be applied anytime to keep the wafer to be etched in a low-particle environment.

Also, the drawings used for illustrating the embodiment of the invention show only the major characteristic parts of the process layout in order to avoid obscuring the invention. Accordingly, the specification and the drawings are to be regarded in an illustrative sense rather than in a restrictive sense.

Figure 1:
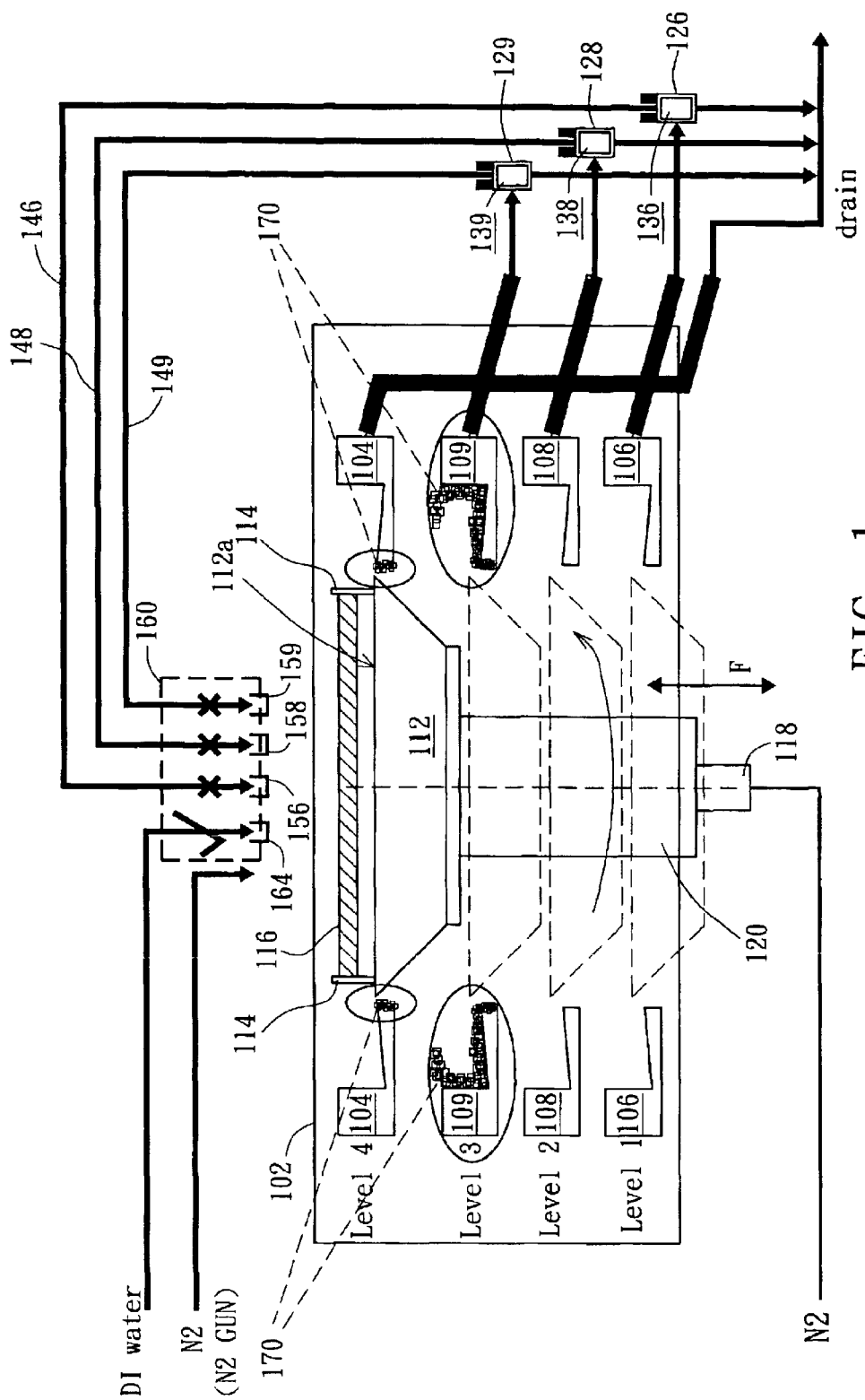
FIG. 1 illustrates a sectional view of a rotational etching tool.
Figure 2:
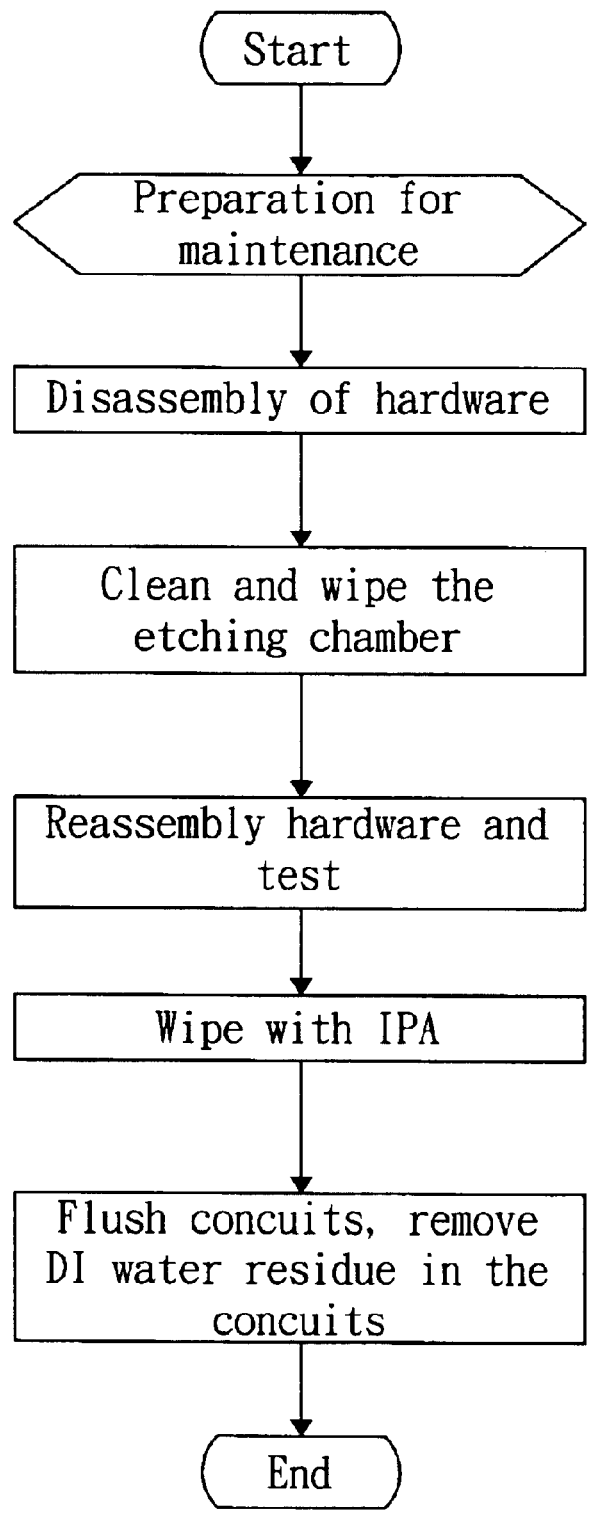
FIG. 2 (prior art) is a block diagram of a conventional PM (Preventive Maintenance) process for rotational etching tool.

Please also refer FIG. 1, illustrating a cross-sectional view of a rotational etching tool. The etching liquid comprises at least one of following acids: hydrofluoric acid, nitric acid, phosphoric acid and sulfuric acid. Also, addition of ammonium fluoride to hydrofluoric acid can be used as etching liquid, so-called "BHF" (buffered hydrogen fluoride) or "BOE" (buffered oxide etch).

The major features of the present invention is that when deionized (DI) water is applied to the surface of the spinning wafer 116 (driven by the rotated chuck 112 at high speed), it is thrown off and splashes onto the walls or edges of the etching chambers. If the chuck 112 is temporally fixed at the position associated to one of process chambers, for example, the first etching chamber, the DI water splashing angles can be increased by changing either the rotation speed of the chuck 112, or the DI water applying positions on the surface of the wafer 116.

Figure 3:
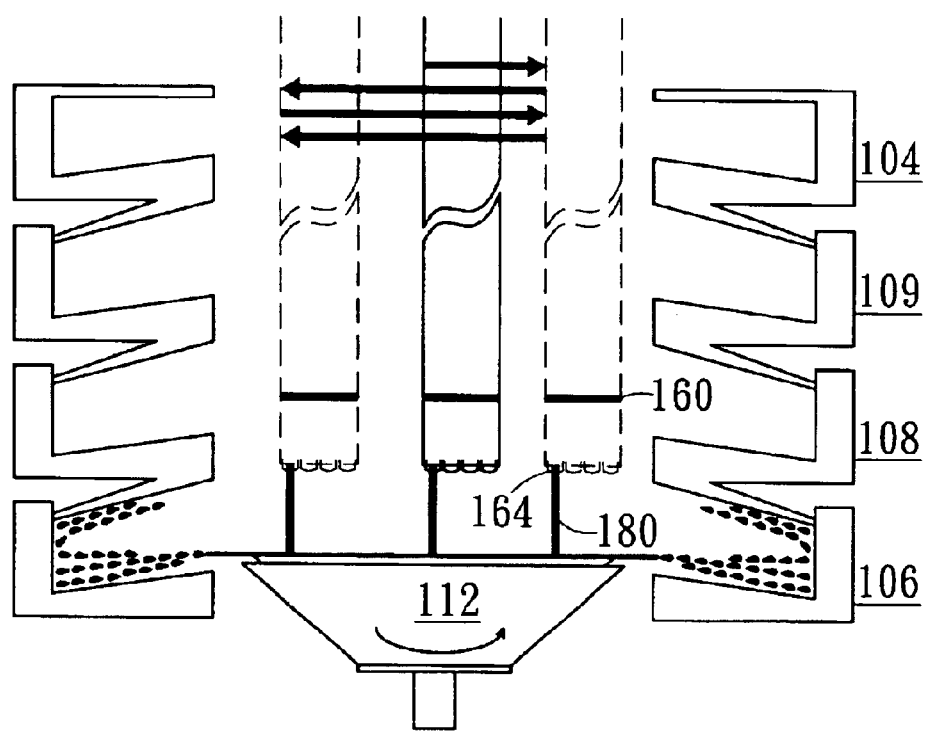
FIG. 3 illustrates the change of DI water applying positions on the wafer according to an embodiment of the invention.
Figure 4C:
FIG. 4C is a hydrodynamic trace simulation of DI water column striking the right side of the wafer surface of FIG. 3.
Figure 4B:
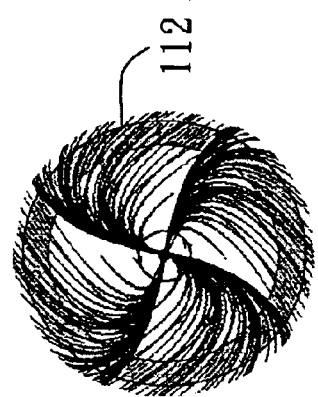
FIG. 4B is a hydrodynamic trace simulation of DI water column striking the center of the wafer surface of FIG. 3.
Figure 4A:
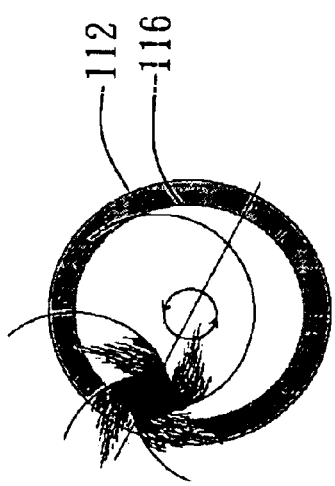
FIG. 4A is a hydrodynamic trace simulation of DI water column striking the left side of the wafer surface of FIG. 3.

FIG. 3 illustrates the change of DI water applying positions on the wafer according to an embodiment of the invention. The DI water column 180 discharged from the medium nozzle 164 (positioned in the medium dispenser 160) strikes the surface of the wafer 116. Also, the position of medium nozzle 164 has been changed, as shown in FIG. 3. FIG. 4A is a hydrodynamic trace simulation of DI water column striking the left side of the wafer surface of FIG. 3. FIG. 4B is a hydrodynamic trace simulation of DI water column striking the center of the wafer surface of FIG. 3. FIG. 4C is a hydrodynamic trace simulation of DI water column striking the right side of the wafer surface of FIG. 3. FIGS. 4A, 4B and 4C indicate that different DI water column striking positions can cause different hydrodynamic traces, thereby creating various splashing angles of DI water and changing the area in which the splashing takes place. Thus, every corner of the etching chamber interior is clean for a certainty.

Figure 5:
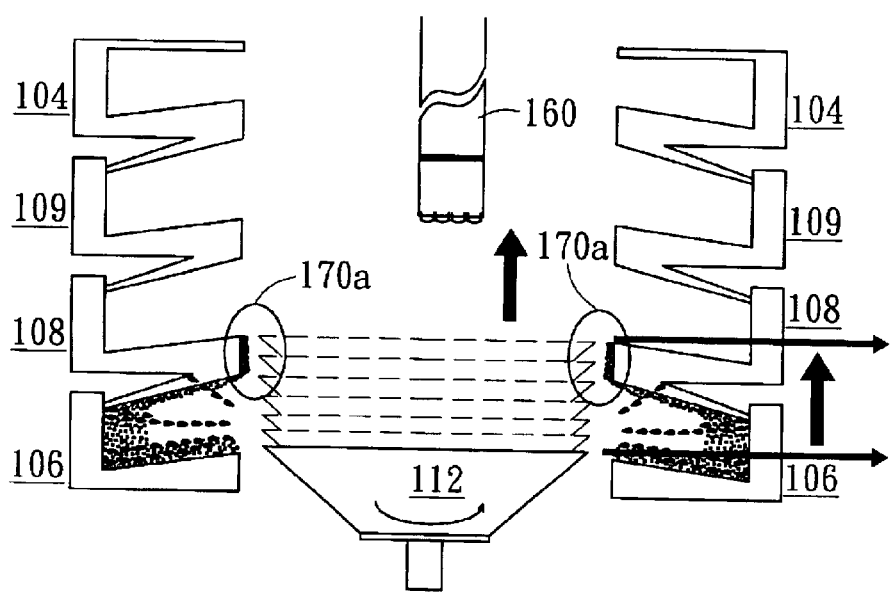
FIG. 5 illustrates the change of chuck position to clean the etching chamber according to another embodiment of the invention.

Additionally, the chuck 112 can be moved upward and downward by the elevated part 120, in order to clean some or all of the reaction chambers (cleaning chamber and etching chambers). For altering (mostly strengthening) the splashing power of DI water, the chuck speed can also be changed during the movement of chuck 112 to clean the etching chamber, especially to clean the etching chamber of which the BOE powders adhere to the walls and edges. FIG. 5 illustrates the change of chuck position to clean the etching chamber according to another embodiment of the invention. It is assumed that the first etching liquid (numeral 136 in FIG. 1) is BOE. After the etching process proceeding for a while, many crystalline BOE particles are not only accumulated in the inner wall of the etching chamber 106, but also brought by airflow and adhere to the sidewall of the adjacent chamber; for example, BOE powder 170a adhere to the sidewall of the second etching chamber 108. In this embodiment, the chuck 112 is rotated at the position associated with the first etching chamber 106 for a while, and DI water keeps striking the surface of the wafer 116. Then, the chuck 112 is moved to the position associated with the second etching chamber 108. During the movement of chuck 112, the chuck rotation speed is increased to strengthen the splashing power and create more splashing angles of DI water. When the chuck 112 passes through the sidewall of the second etching chamber 108, the splashed DI water will hit the sidewall and wash the BOE powders 170a away. Although, the upward movement of the chuck 112 is taken to illustrate the sidewall clean herein, the downward movement the chuck 112 is also conceivable.

Furthermore, all of the etching chambers and sidewalls thereof can be well cleaned and maintained according to the methodology of the present invention. For example, the chuck 112 is rotated at the position associated with the first etching chamber 106 for a while, and DI water keeps striking the surface of the wafer 116 to clean the first etching chamber 106. Meanwhile, the change of DI water column striking positions can also be incorporated to create more splashing angles and alter the splashing extent of DI water, as shown in FIG. 3. Afterward, the chuck 112 is moved back and forth between the first etching chamber 106 and the second etching chamber 108 to clean the sidewall of the second etching chamber 108. Then, the chuck 112 is temporally fixed at the position associated with the second etching chamber 108 for a while to do the cleaning job. Next, the chuck 112 is moved back and forth between the second etching chamber 108 and the third etching chamber 109 to clean the sidewall of the third etching chamber 109. The steps of aforementioned description are repeated until all of the etching chambers and sidewalls thereof are well cleaned and maintained. Also, whether the chuck 112 is fixed or weather the chuck 112 is moving, the rotation speed of chuck 112 can be altered to create more splashing angles of DI water After the etching chambers are totally cleaned, the chuck 112 can further be moved to the position associated with the cleaning chamber 104, and rotated for a while. During the rotation, DI water is discharged to the wafer's surface. Then, turn off DI water and turn on $N_2$ gas. The chuck 112 keeps rotating while $N_2$ gas is fed into the chamber. About few seconds $N_2$ purge, the surface of the wafer is completely dried.

It is noted that the PM program provided according to the invention may include the PM steps for all of the process chambers and sidewalls. The PM program incorporated into the computer connected to the rotational etching tool can be programmed whenever an engineer feels it is needed. However, the PM program can be divided into several sets of instructions, and those sets of instructions can be selectively executed, depending on the actual conditions of the etching tool. Moreover, during the execution of PM program of the invention, DI water ejecting into the process chambers for cleaning can be drawn off through the discharged conduits, not flowing into the etching liquid tank.

In the following, an example is given to describe the methodology of the present invention, but it is known to people skilled in the art that the invention is not limited thereto.

EXAMPLE

Please also refer FIG. 1. It is assumed that BOE is used as the second etching liquid.

(1) First, a wafer 116 is held over the chuck 112 (using a vacuum or floats on an air cushion), and then spins via the rotated chuck 112.

(2) Clean the first etching chamber 106 and the second etching chamber 108—

The chuck 112 is fixed at the position associated with the first etching chamber 106, and rotates at a speed of 500 rpm for 5 seconds. Then, the chuck 112 is moved upward to the position associated with the second etching chamber 108 and rotates at a speed of 1000 rpm for 5 seconds. Afterward, the chuck 112 returns the position associated with the first etching chamber 106. These steps described above are repeated 8 times. Meanwhile, the sidewall of the second etching chamber 108 can also be washed by splashed DI water.

(3) Clean the second etching chamber 108 and the third etching chamber 109—

The chuck 112 is fixed at the position associated with the third etching chamber 109, and rotates at a speed of 1000 rpm for 5 seconds. Then, the chuck 112 is moved downward to the position associated with the second etching chamber 108 and rotates at a speed of 500 rpm for 5 seconds. Afterward, the chuck 112 returns the position associated with the third etching chamber 109. These steps described above are repeated 8 times. Meanwhile, the sidewall of the third etching chamber 109 can also be washed by splashed DI water.

(4) Clean the third etching chamber 109 and the cleaning chamber 104—

The chuck 112 is fixed at the position associated with the cleaning chamber 104, and rotates at a speed of 1000 rpm for 5 seconds. Then, the chuck 112 is moved downward to the position associated with the third etching chamber 109 and rotates at a speed of 500 rpm for 5 seconds. Afterward, the chuck 112 returns the position associated with the cleaning chamber 104. These steps described above are repeated 8 times. Meanwhile, the sidewall of the cleaning chamber 104 can also be washed by splashed DI water.

(5) Clean the second etching chamber 108 specifically—

Since a BOE liquid is used as the second etching liquid, a certain quantities of BOE powders will accumulate in the interior of the second etching chamber, and required specific maintenance. The chuck 112 is fixed at the position associated with the second etching chamber 108, and rotates at a speed of 500 rpm for 500 seconds. Meanwhile, the change of DI water column striking positions is incorporated; for example, swiveling the medium dispenser 160, to create more splashing angles and alter the splashing extent of DI water. Next, DI water is turned off, but the chuck 112 keeps rotating for 5 seconds.

(6) Final clean and dry—

The chuck 112 is moved to the position associated with the cleaning chamber 104. Then, turn on DI water, and rotates the chuck 112 for 5 seconds. Afterward, turn off DI water. For drying the wafer, turn on $N_2$ gas, and rotates the chuck 112 for 20 seconds.

Compared with the conventional methodology of manual PM method, the PM method of the invention requires neither the preparation (i.e. chemical splash goggles, chemical resistant garment and gloves) nor machine disassembly/reassembly. The only thing the engineer has to do is to decide which etching chamber needs to be cleaned, and then execute the PM program of the invention. The wafer particle test results could be an important index for the engineer. If the particle test results fail, the PM program can be immediately executed to clean the etching chambers, without any preparation and mechanical disassembly. Also, it takes a very short time to run the PM program of the invention, about 15 minutes to clean all of the chambers. Thus, the PM program can be executed one time a day, right before operating the etching tool. According to the aforementioned descriptions, the PM method of the invention has advantages of timesaving, auto-clean, and high PM efficiency; thus, it can be frequently use. The clean interior of the etching tool decreases the possibility of particle contamination of wafer, which benefits the production yield of semiconductor devices.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of cleaning and maintenance used for a rotational etching tool, wherein the rotational etching tool comprises a wafer supporting means, at least a cleaning chamber and an etching chamber, the wafer supporting means is moveable between the cleaning chamber and the etching chamber, at least a nozzle is positioned above the wafer supporting means for ejecting a cleaning liquid, the method comprising steps of:

floating a wafer on air cushion over the wafer supporting means, and spinning the wafer at a first rotating speed;

moving the wafer supporting means to a first position in one of the chambers;

applying the cleaning liquid to the wafer while continuing to rotate the wafer at the first rotating speed, thereby cleaning one of the chambers;

moving the wafer supporting means to a second position in the other chamber; and applying the cleaning liquid to the wafer, changing a rotation speed of the wafer from the first rotating speed to a second rotating speed, and rotating the wafer supporting means at the second rotating speed, thereby cleaning the other chamber.

2. The method according to claim 1, wherein the second rotating speed is larger than the first rotating speed.

3. The method according to claim 1, wherein the rotation speed of the wafer is altered between the second rotating speed and the first rotating speed as the wafer supporting means is moved between the chambers.

4. The method according to claim 1, further comprises step of changing a relative position between the nozzle for ejecting the cleaning liquid and the wafer, so as to create more splashing angles of the cleaning liquid.

5. The method according to claim 1, wherein the wafer supporting means rotates at the first rotating speed when positioned in the cleaning chamber.

6. The method according to claim 1, wherein the cleaning chamber and the etching chamber are connected to a cleaning liquid tank and a etching liquid tank, containing the cleaning liquid and an etching liquid, respectively.

7. The method according to claim 5, wherein the wafer supporting means rotates at the second rotating speed when positioned in the etching chamber.

8. The method according to claim 6, wherein the cleaning liquid is deionized (DI) water.

9. The method according to claim 6, wherein the etching liquid is a buffered mixture comprising ammonium fluoride and hydrofluoric acid.

10. A method of cleaning and maintenance used for a rotational etching tool, wherein the rotational etching tool comprises a wafer supporting means, a cleaning chamber, at least a first etching chamber and a second etching chamber, the wafer supporting means is moveable between the cleaning chamber and the first and second etching chambers, at least a nozzle is positioned above the wafer supporting means for ejecting a cleaning liquid, the method comprising steps of:

floating a wafer on air cushion over the wafer supporting means;

moving the wafer supporting means to a first position in any one of the cleaning chamber, the first etching chamber, or the second etching chamber and spinning the wafer support means at a first rotating speed;

applying the cleaning liquid to the wafer while continuing to rotate the wafer at the first rotating speed, thereby cleaning any one of the cleaning chamber, the first etching chamber, or the second etching chamber;

moving the wafer supporting means to a second position in another of the cleaning chamber, the first etching chamber, or the second etching chamber; and applying the cleaning liquid to the wafer, changing a rotation speed of the wafer from the first rotating speed to a second rotating speed, and rotating the wafer supporting means at the second rotating speed, thereby cleaning another of the cleaning chamber, the first etching chamber or second etching chamber.

11. The method according to claim 10, wherein when the wafer supporting means stays at the first position, it rotates at the first rotating speed for a first duration, and then changes to the second rotating speed and rotates for a second duration.

12. The method according to claim 10, wherein the cleaning chamber is positioned above the second etching chamber, and the first etching chamber is positioned below the second etching chamber.

13. The method according to claim 10, wherein the cleaning chamber, the first and second etching chambers are connected to a cleaning liquid tank, a first and second etching liquid tanks containing the cleaning liquid, a first and second etching liquids, respectively.

14. The method according to claim 11, further comprises the step of changing a relative position between the nozzle and the wafer, so as to create more splashing angles of the cleaning liquid.

15. The method according to claim 12, wherein the wafer supporting means is moved to the first etching chamber and rotates at the first rotating speed; then, moved to the second etching chamber and rotates at the second rotating speed.

16. The method according to claim 12, wherein the wafer supporting means is moved to the second etching chamber and rotates at the first rotating speed; then, moved to the cleaning chamber and rotates at the second rotating speed.

17. The method according to claim 13, wherein the cleaning liquid is deionized (DI) water.

18. The method according to claim 13, wherein one of the first and second etching liquids is a buffered mixture comprising ammonium fluoride and hydrofluoric acid.

19. A method of cleaning and maintenance used for a rotational etching tool, wherein the rotational etching tool comprises a wafer supporting means and at least a first process chamber and a second process chamber, the wafer supporting means is moveable between the process chambers, a nozzle is positioned above the wafer supporting means for ejecting a cleaning liquid, the method comprising steps of:

(a) floating a wafer on an air cushion over the wafer supporting means, and moving the wafer supporting means to a position in the first process chamber;

(b) applying the cleaning liquid to the wafer;

(c) spinning the wafer supporting means at a first rotating speed for a duration of time, thereby cleaning the first process chamber;

(d) moving the wafer supporting means to a position in the second process chamber; and (e) applying the cleaning liquid to the wafer and changing the rotation speed of the wafer supporting means to a second rotating speed and rotating the wafer supporting means at the second rotating speed for a duration of time to clean the second process chamber.

20. The method according to claim 19, further comprises step of changing a relative position between the nozzle for ejecting the cleaning liquid and the wafer, so as to create more splashing angles of the cleaning liquid.

21. The method according to claim 19, wherein the first and second process chambers are a cleaning chamber and an etching chamber.

22. The method according to claim 19, further comprising:

(f) moving the wafer supporting means to the first process chamber; and (g) repeating steps (c) through (f).

23. The method according to claim 21, wherein the cleaning chamber and the etching chamber are connected to a cleaning liquid tank and an etching liquid tank, containing the cleaning liquid and an etching liquid, respectively.

24. The method according to claim 23, wherein the cleaning liquid is deionized (DI) water.

25. The method according to claim 23, wherein the etching liquids is a buffered mixture comprising ammonium fluoride and hydrofluoric acid.

26. A method of cleaning and maintenance used for a rotational etching tool, wherein the rotational etching tool comprises a wafer supporting means and at least a first process chamber and a second process chamber, the wafer supporting means is moveable between the process chambers, at least a nozzle is positioned above the wafer supporting means for ejecting a cleaning liquid, the method comprising steps of:

(a) floating a wafer on an air cushion over the wafer supporting means, and moving the wafer supporting means to a position in the first process chamber;

(b) applying the cleaning liquid to the wafer;

(c) spinning the wafer supporting means at a first rotating speed for a first duration, thereby cleaning the first process chamber;

(d) moving the wafer supporting means to a position in the second process chamber, and during the movement of the wafer supporting means from first process chamber to the second process chamber changing a rotation speed of the wafer supporting means from said first rotating speed to a second rotating speed and rotating for a second duration; and (f) applying the cleaning liquid to the wafer and rotating the wafer supporting means at the second rotating speed, thereby cleaning the second process chamber.

27. The method according to claim 26, wherein the process chambers comprise a cleaning chamber and an etching chamber.

28. The method according to claim 27, wherein the cleaning chamber and the etching chamber are connected to a cleaning liquid tank and an etching liquid tank, containing the cleaning liquid and an etching liquid, respectively.

29. The method according to claim 28, wherein the cleaning liquid is deionized (DI) water.

30. The method according to claim 28, wherein the etching liquids is a buffered mixture comprising ammonium fluoride and hydrofluoric acid.

* * * * *